(12) United States Patent
Kamgaing et al.

(10) Patent No.: US 10,910,305 B2
(45) Date of Patent: Feb. 2, 2021

(54) MICROELECTRONIC DEVICES DESIGNED WITH CAPACITIVE AND ENHANCED INDUCTIVE BUMPS

(71) Applicant: Intel Corporation, Santa Clara, CA (US)

(72) Inventors: Telesphor Kamgaing, Chandler, AZ (US); Georgios C. Dogiamis, Chandler, AZ (US); Sasha N. Oster, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/464,972

(22) PCT Filed: Dec. 30, 2016

(86) PCT No.: PCT/US2016/069622
§ 371 (c)(1),
(2) Date: May 29, 2019

(87) PCT Pub. No.: WO2018/125241
PCT Pub. Date: Jul. 5, 2018

(65) Prior Publication Data
US 2019/0326213 A1 Oct. 24, 2019

(51) Int. Cl.
*H01L 23/64* (2006.01)
*H01L 23/522* (2006.01)
(Continued)

(52) U.S. Cl.
CPC .......... *H01L 23/5223* (2013.01); *H01G 4/33* (2013.01); *H01G 4/38* (2013.01); *H01L 23/488* (2013.01);
(Continued)

(58) Field of Classification Search
CPC ............ H01L 23/5223; H01L 23/5227; H01L 23/642; H01L 23/645; H01L 24/16;
(Continued)

(56) References Cited

U.S. PATENT DOCUMENTS 7,298,019 B2  11/2007  Lee
2004/0184217 A1  9/2004  List et al.
(Continued)

FOREIGN PATENT DOCUMENTS

KR  10-2006-0001362  1/2006

OTHER PUBLICATIONS

International Search Report and Written Opinion for International Patent Application No. PCT/US2016/069622 dated Sep. 29, 2017, 9 pgs.
(Continued)

*Primary Examiner* — Stephen W Smoot
(74) *Attorney, Agent, or Firm* — Schwabe, Williamson & Wyatt, P.C.

(57) ABSTRACT

Embodiments of the invention include a microelectronic device that includes a substrate having transistor layers and interconnect layers including conductive layers to form connections to transistor layers. A capacitive bump is disposed on the interconnect layers. The capacitive bump includes a first electrode, a dielectric layer, and a second electrode. In another example, an inductive bump is disposed on the interconnect layers. The inductive bump includes a conductor and a magnetic layer that surrounds the conductor.

22 Claims, 9 Drawing Sheets

(51) Int. Cl.
*H01G 4/33* (2006.01)
*H01G 4/38* (2006.01)
*H01L 23/488* (2006.01)
*H01L 23/50* (2006.01)
*H01L 23/00* (2006.01)
*H01L 49/02* (2006.01)
*H05K 1/16* (2006.01)

(52) U.S. Cl.
CPC .......... *H01L 23/50* (2013.01); *H01L 23/5227* (2013.01); *H01L 23/642* (2013.01); *H01L 23/645* (2013.01); *H01L 24/11* (2013.01); *H01L 24/16* (2013.01); *H01L 28/10* (2013.01); *H01L 28/60* (2013.01); *H05K 1/162* (2013.01); *H01L 2224/16225* (2013.01); *H01L 2224/16268* (2013.01); *H01L 2924/19041* (2013.01); *H01L 2924/19042* (2013.01); *H05K 2201/09763* (2013.01)

(58) Field of Classification Search
CPC . H01L 2224/16268; H01L 2924/19041; H01L 2924/19042; H01L 28/10; H01L 28/40; H01L 28/60
See application file for complete search history.

(56) References Cited

U.S. PATENT DOCUMENTS

| 2006/0205200 | A1 | 9/2006 | Richiuso | |
| 2007/0205520 | A1* | 9/2007 | Chou | H01L 24/48 257/780 |
| 2008/0030968 | A1 | 2/2008 | Mashino | |
| 2009/0126983 | A1* | 5/2009 | Harvey | H05K 3/4602 174/266 |
| 2009/0273079 | A1* | 11/2009 | Lovskog | H01L 24/16 257/737 |
| 2010/0059858 | A1 | 3/2010 | Tang et al. | |

OTHER PUBLICATIONS

International Preliminary Report on Patentability for International Patent Application No. PCT/US2016/069622, dated Jul. 11, 2019, 8 pages.

* cited by examiner

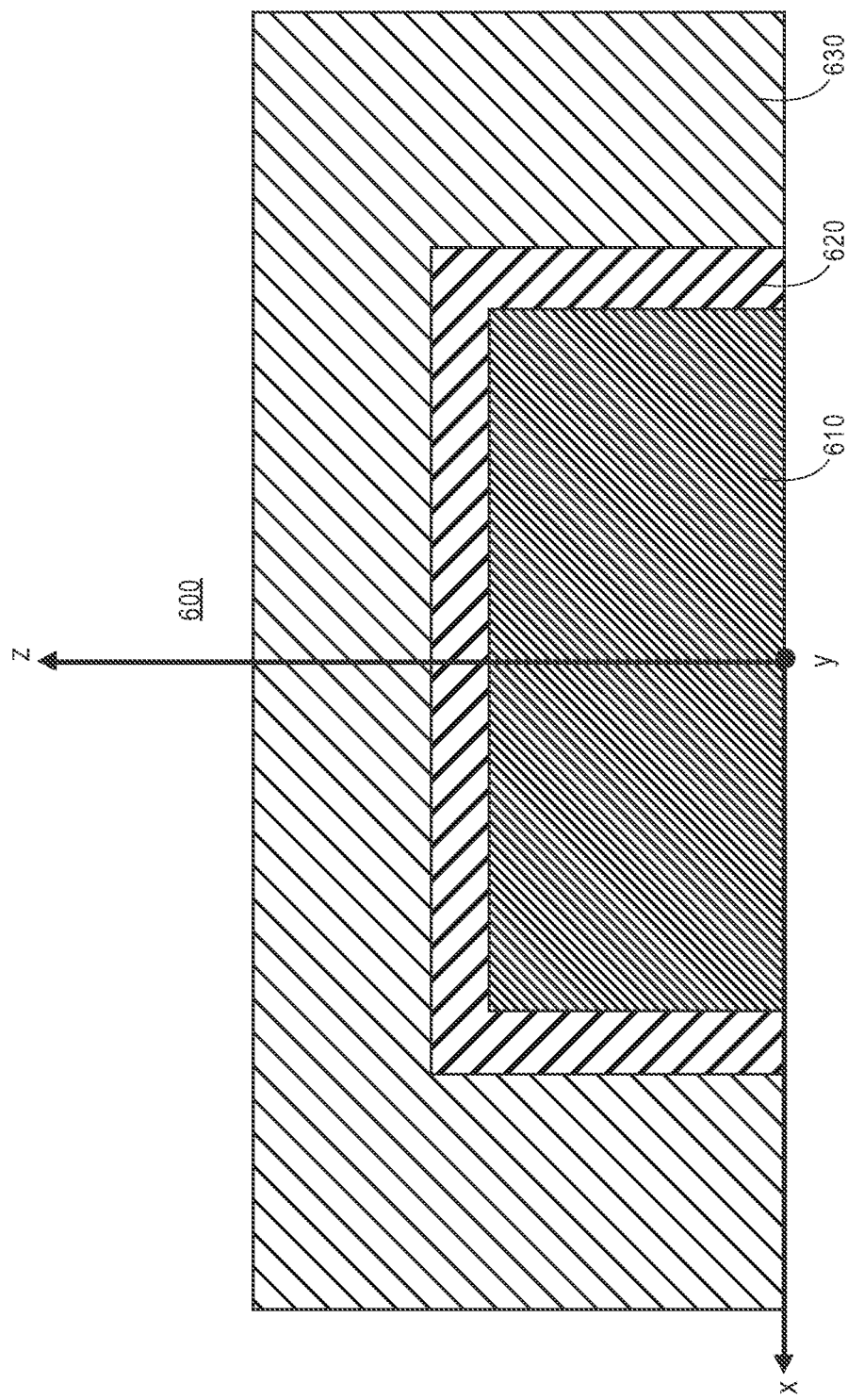

MICROELECTRONIC DEVICES DESIGNED WITH CAPACITIVE AND ENHANCED INDUCTIVE BUMPS

CROSS-REFERENCE TO RELATED APPLICATION

This patent application is a U.S. National Phase Application under 35 U.S.C. § 371 of International Application No. PCT/US2016/069622, filed Dec. 30, 2016, entitled "MICROELECTRONIC DEVICES DESIGNED WITH CAPACITIVE AND ENHANCED INDUCTIVE BUMPS," which designates the United States of America, the entire disclosure of which is hereby incorporated by reference in its entirety and for all purposes.

FIELD OF THE INVENTION

Embodiments of the present invention relate generally to the manufacture of semiconductor devices. In particular, embodiments of the present invention relate to microelectronic devices that are designed with capacitive and enhanced inductive bumps.

BACKGROUND OF THE INVENTION

Future wireless and wireline communication products are targeting operation frequencies much higher than the lower GHz range utilized presently. For instance 5G ($5^{th}$ generation mobile networks or $5^{th}$ generation wireless systems) communications are expected to operate at a frequency greater than or equal to 15 GHz. Moreover, the current WiGig (Wireless Gigabit Alliance) products operate around 60 GHz (e.g. 57-66 GHz worldwide). Other applications including high performance computing, medical imaging, and sensing utilize wireless communication technologies in the millimeter wave frequencies (e.g., 24 GHz-300 GHz).

In addition, advanced detection and other high frequency imaging approaches are being pushed and will be miniaturized to the point where these approaches are an integral part of almost any smart device. At high frequency ranges, femto Farad (fF) and sub-fF capacitance is required in the realization of the mm-wave and sub-Terahertz (sub-THz) circuits. Capacitors on either the die or the package may be susceptible to process variation or not conveniently located for some matching and filtering circuits.

BRIEF DESCRIPTION OF THE DRAWINGS

FIG. 6A illustrates a cross-sectional view of a capacitive bump in accordance with one embodiment.

DETAILED DESCRIPTION OF THE INVENTION

Figure 1:
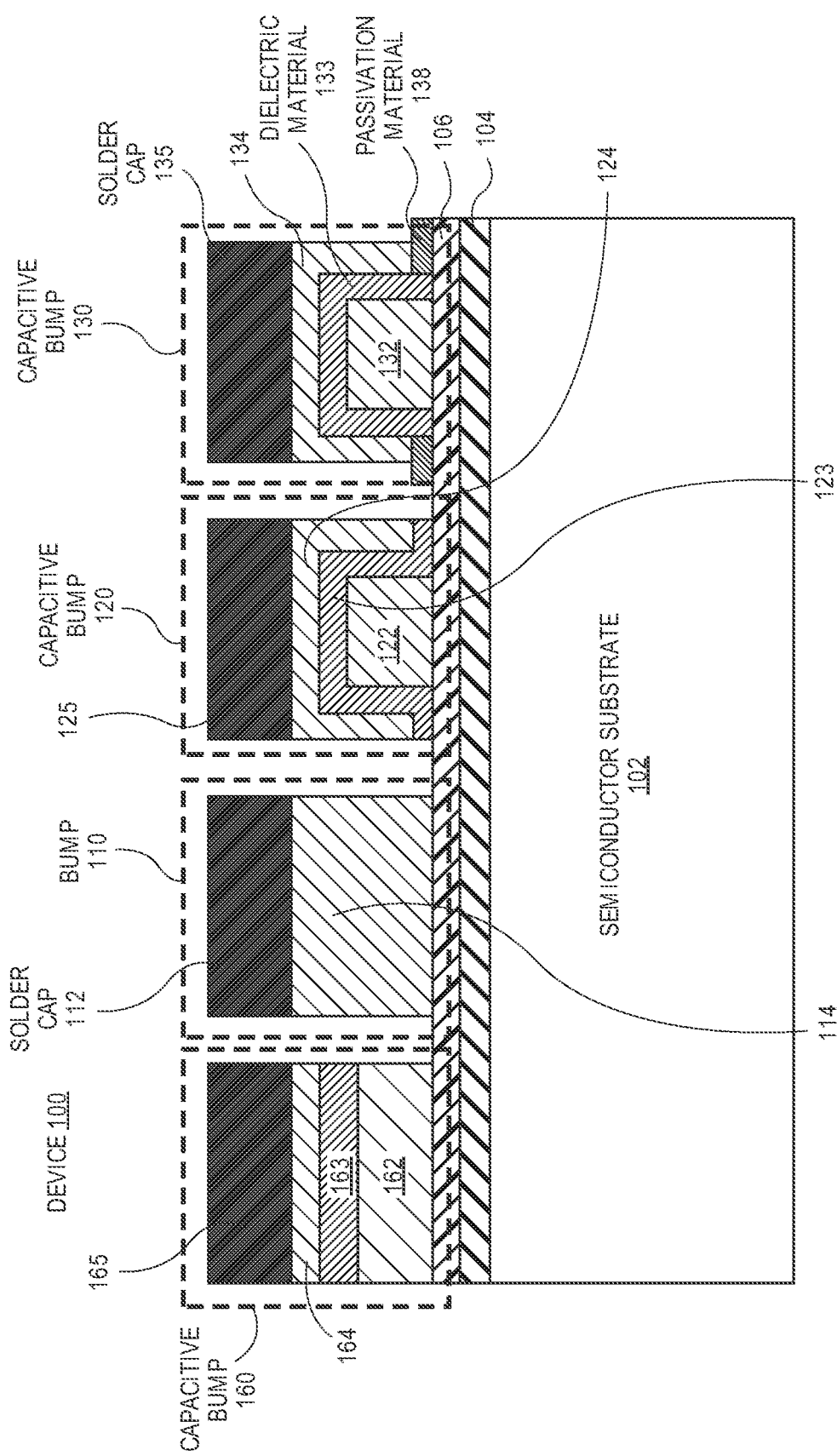
FIG. 1 illustrates a cross-sectional view of a microelectronic device having capacitive bumps in accordance with one embodiment.

Described herein are microelectronic devices that are designed with capacitive and enhanced inductive bumps. In the following description, various aspects of the illustrative implementations will be described using terms commonly employed by those skilled in the art to convey the substance of their work to others skilled in the art. However, it will be apparent to those skilled in the art that embodiments of the present invention may be practiced with only some of the described aspects. For purposes of explanation, specific numbers, materials and configurations are set forth in order to provide a thorough understanding of the illustrative implementations. However, it will be apparent to one skilled in the art that embodiments of the present invention may be practiced without the specific details. In other instances, well-known features are omitted or simplified in order to not obscure the illustrative implementations.

Various operations will be described as multiple discrete operations, in turn, in a manner that is most helpful in understanding embodiments of the present invention, however, the order of description should not be construed to imply that these operations are necessarily order dependent. In particular, these operations need not be performed in the order of presentation.

For high frequency (e.g., 5G, WiGig) wireless applications of millimeter (e.g., 1-10 mm, any mm wave or higher) wave communication systems or even lower frequency applications, the present design utilizes capacitors integrated in some of the die bumps primarily for high frequency applications. Another embodiment of the present design enhances the bump inductance by using high permeability material.

The present design modifies the die bump plating and fabrication operation to include a dielectric layer that makes the bump capacitive. In another embodiment, a fabrication operation is added to the bump fabrication to make it highly inductive. The present design utilizes capacitive bumps, which are less susceptible to process variations and have higher qualify factors than on-die metal insulator metal (MIM) capacitors or metal finger capacitors (MFCs).

The combination of capacitive bumps with standard or inductive connections (e.g., vias) enable resonant connections (e.g., vias) that can act as a stopband filter for certain frequencies while letting signals for other frequencies through. The capacitive bump connections can be used with on-package inductors to create hybrid high-Q filters for millimeter wave and sub-THz circuits and modules. Hybrid in this case means some of the components of the filters are on-die while others are off-die, e.g., on the package substrate. The bump capacitance can be made using dielectric material in the micron thickness range to enable high frequency operation while improving the tolerance. Dielectric thicknesses in the micron thickness range are not effective for planar capacitors on chip.

In one example, a 5G architecture operates at a high frequency (e.g., at least 20 GHz, at least 25 GHz, at least 28 GHz, at least 30 GHz, at least 39 GHz, at least 60 GHz, at least 73 GHz, etc.) and may also have approximately 1-50 gigabits per second (Gbps) connections to end points. In another example, the present design operates at lower frequencies (e.g., at least 4 GHz, approximately 4 GHz).

FIG. 1 illustrates a cross-sectional view of a microelectronic device having capacitive bumps in accordance with one embodiment. The microelectronic device 100 includes a semiconductor substrate 102 (e.g., Silicon semiconductor substrate), front end layers 104 for forming devices (e.g., transistors), and back end layers 106 (e.g., interconnect layers 106) having conductive layers isolated with dielectric layers for connecting the devices of the front end layers to conductive bumps (e.g., capacitive bump 160, bump 110, capacitive bump 120, capacitive bump 130). A traditional bump 110 includes an electrode 114 (e.g., Copper electrode) and an optional solder cap 112. A capacitive bump 120 (e.g., metal insulator metal (MIM) capacitor 120) includes electrodes 122 and 124 (e.g., Copper electrodes), a dielectric material 123, and an optional solder cap 125. A capacitive bump 130 (e.g., metal insulator metal (MIM) capacitor 130) includes electrodes 132 and 134 (e.g., Copper electrodes), a dielectric material 133, and an optional solder cap 135. The electrode 134 is disposed on passivation material 138. A capacitive bump 160 (e.g., metal insulator metal (MIM) capacitor 160) includes electrodes 162 and 164 (e.g., Copper electrodes), a dielectric material 163, and an optional solder cap 165.

In one example, each electrode 114, 122, 132, and 162 is electrically coupled to a conductive pad layer of the back end layers 106 to form an electrical connection with a semiconductor device of the front end layers 104. The electrodes of the bumps 120 and 130 are thick enough (e.g., approximately at least 200 hundred nanometers, at least one micron, at least 5 microns, at least 10 microns, etc.) to achieve a high quality factor in comparison to thin metal layers used in the back end layers 106. The dielectric material 163, 123, and 133 can have a thickness with a range of several hundred nanometers to a few microns. The optional solder material (e.g., solder caps) enable connection to a substrate package or another microelectronic device (e.g., die).

Figure 2A:
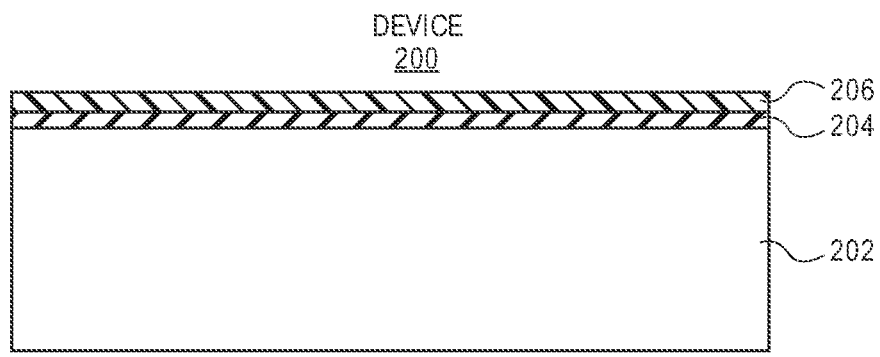
FIGS. 2A-2E illustrate a process for manufacturing a microelectronic device having a capacitive bumps in accordance with one embodiment.
Figure 2B:
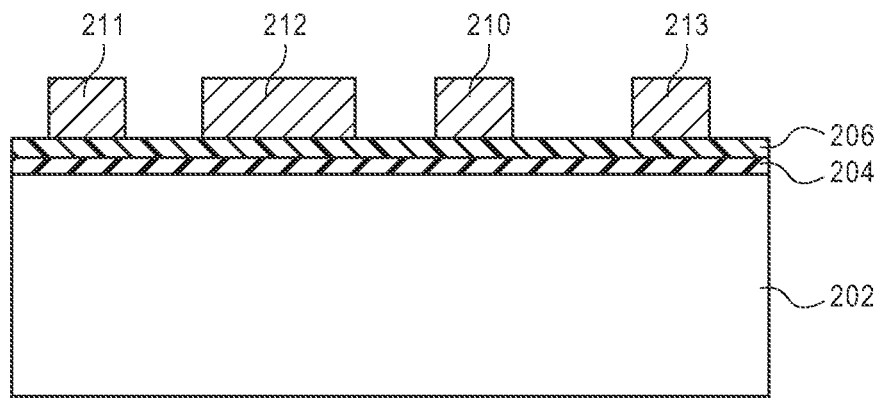
Figure 2C:
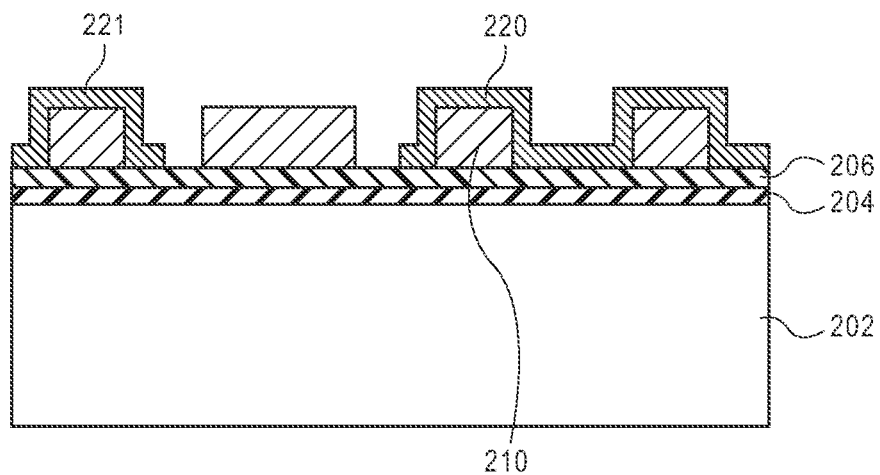
Figure 2D:
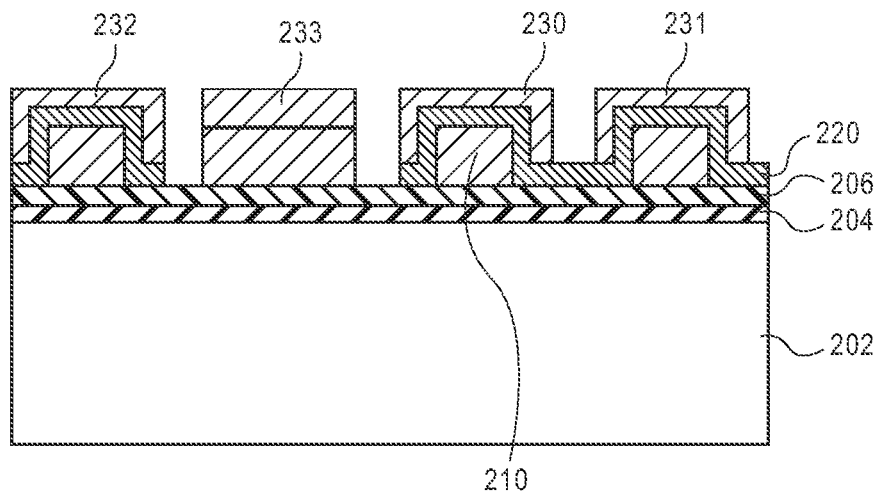
Figure 2E:
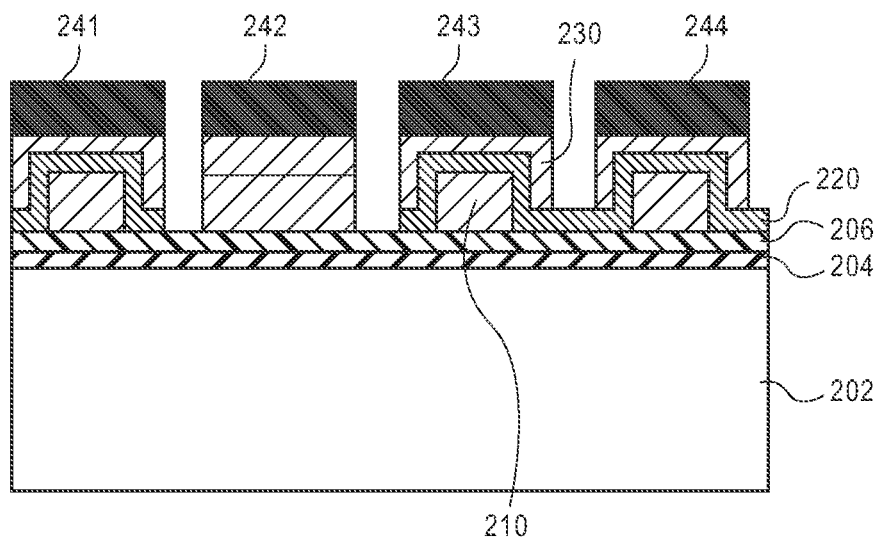

FIGS. 2A-2E illustrate a process for manufacturing a microelectronic device having a capacitive bumps in accordance with one embodiment. The microelectronic device 200 includes a semiconductor substrate 202 having front end layers 204 and back end layers 206 as illustrated in FIG. 2A. Electrodes 210-213 of different sized conductive bumps are formed (e.g., plated, polished) on the back end layers as illustrated in FIG. 2B. Then, a dielectric material 220-221 is formed on capacitive and non-ohmic bumps as illustrated in FIG. 2C. Additional electrodes 230-233 are formed (e.g., plated) on the bumps as illustrated in FIG. 2D. Then, solder caps 241-244 are optionally formed on the bumps as needed as illustrated in FIG. 2E.

Figure 3:
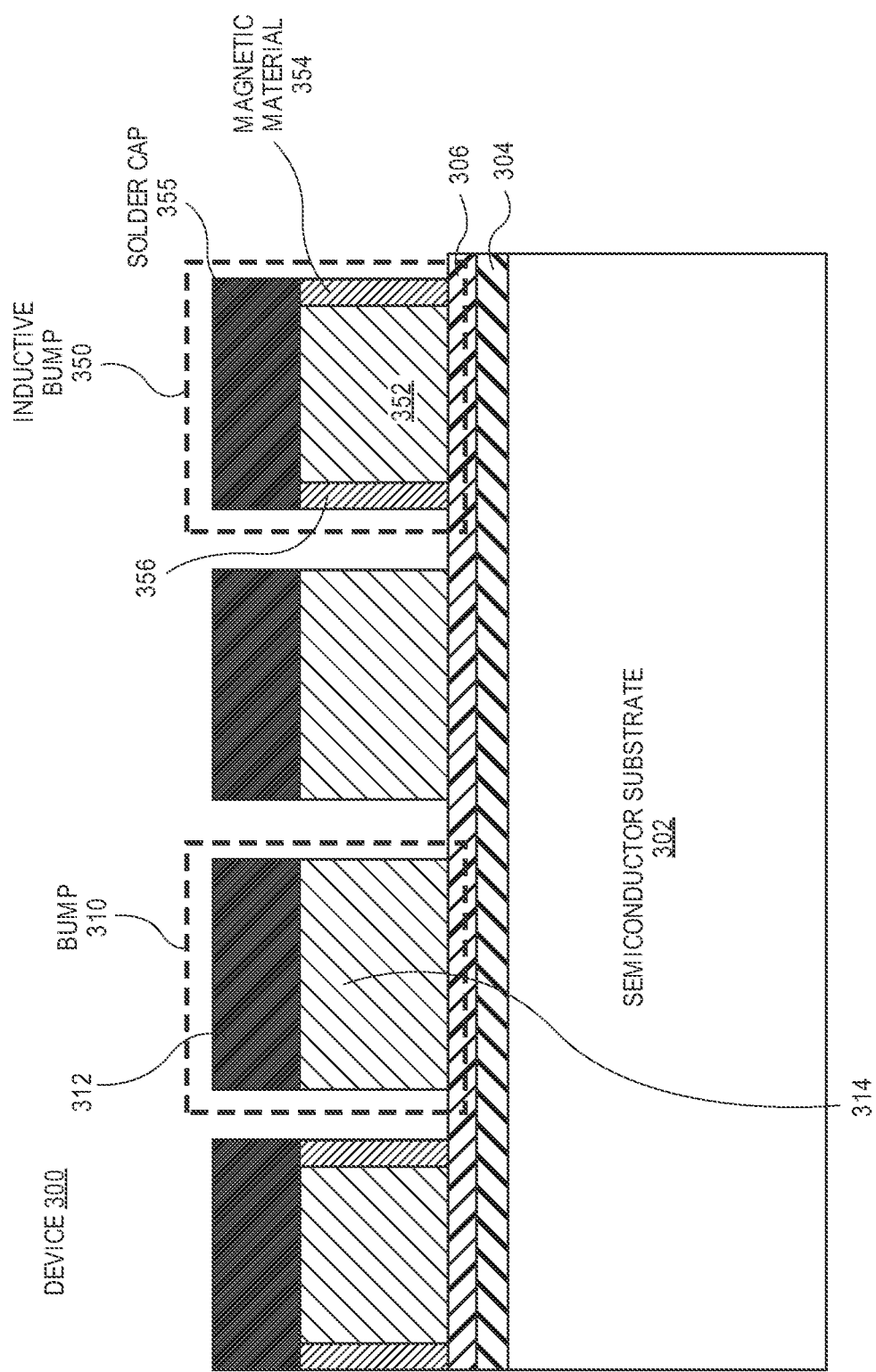
FIG. 3 illustrates a cross-sectional view of a microelectronic device having inductive bumps in accordance with one embodiment.

FIG. 3 illustrates a cross-sectional view of a microelectronic device having inductive bumps in accordance with one embodiment. The microelectronic device 300 includes a semiconductor substrate 302 (e.g., Silicon semiconductor substrate), front end layers 304 for forming devices (e.g., transistors), and back end layers 306 (e.g., interconnect layers 306) having conductive layers isolated with dielectric layers for connecting the devices of the front end layers to conductive bumps (e.g., bump 310, inductive bump 350). A traditional bump 310 includes an electrode 314 (e.g., Copper electrode) and an optional solder cap 312. An inductive bump 350 includes conductor 352 (e.g., Gold conductor, Aluminum conductor, Copper conductor 352), magnetic material 354 and 356 (e.g., high permeability magnetic material having permeability of at least 1.5 to 100), and an optional solder cap 355. The inductive bump 350 is achieved by surrounding the standard bump with high permeability magnetic material 354-356. A high level process flow for making the inductive bump includes plating all copper pillars (e.g., conductor 352), coating the inductive bumps (e.g., pillars) with magnetic material, and applying solder cap to all bumps to enable connection to a substrate package or another microelectronic device (e.g., die). The magnetic material of the inductive bumps can be designed for lower frequency operation (e.g., 5-200 MHz frequency range).

Figure 4:
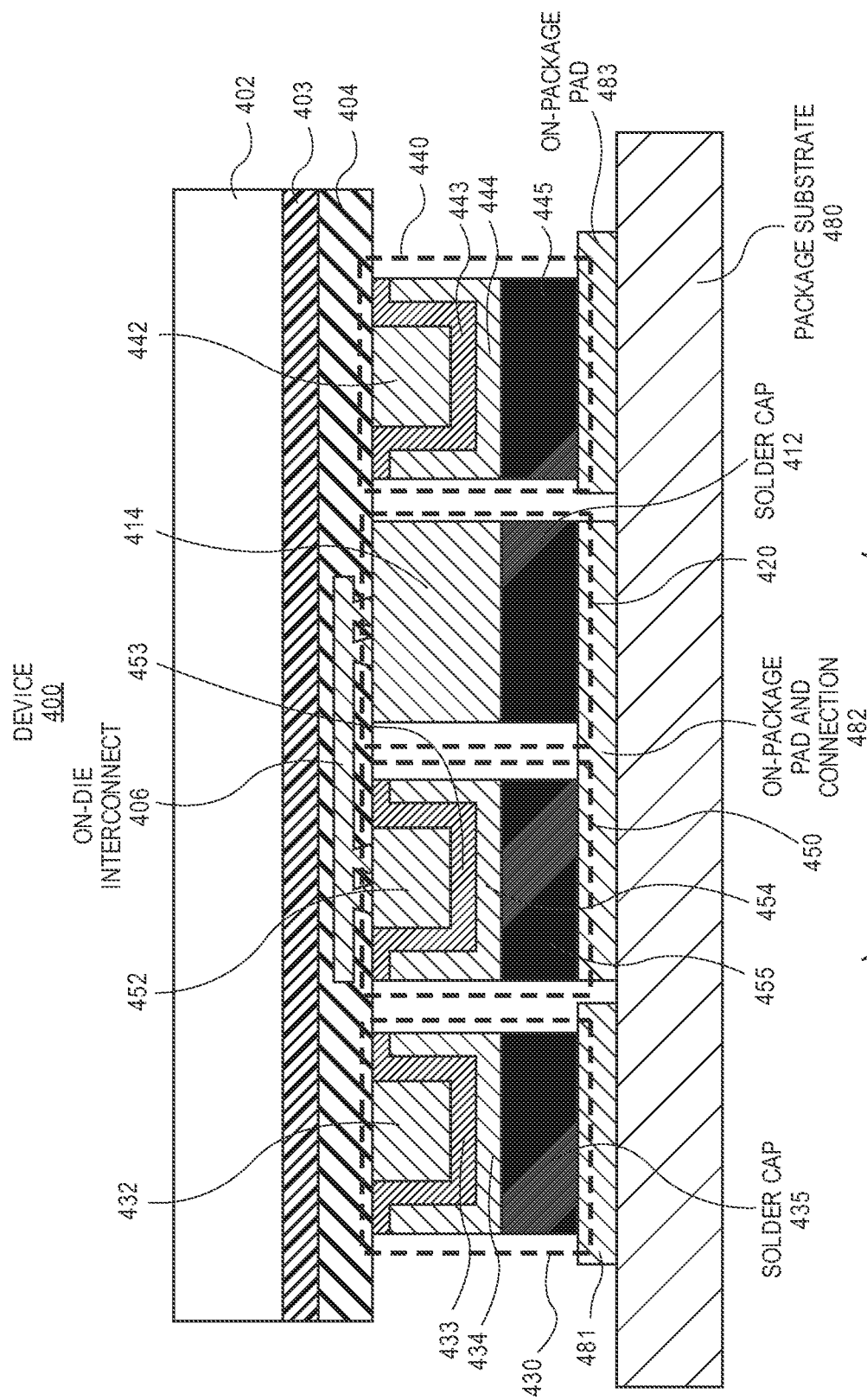
FIG. 4 illustrates a cross-sectional view of a microelectronic device having capacitive bumps that are coupled to a package substrate in accordance with one embodiment.

FIG. 4 illustrates a cross-sectional view of a microelectronic device having capacitive bumps that are coupled to a package substrate in accordance with one embodiment. The microelectronic device 400 includes a semiconductor substrate 402 (e.g., Silicon semiconductor substrate), front end layers 403 for forming devices (e.g., transistors), back end layers 404 (e.g., back end layers 404 including on die interconnect 406) having conductive layers isolated with dielectric layers for connecting the devices of the front end layers to conductive bumps (e.g., bump 420, capacitive bumps 430, 440, and 450). A traditional bump 420 includes an electrode 414 (e.g., Copper electrode) and an optional solder cap 412. A capacitive bump 450 (e.g., metal insulator metal (MIM) capacitor 450) includes electrodes 452 and 454 (e.g., Copper electrodes), a dielectric material 453, and an optional solder cap 455. A capacitive bump 430 (e.g., metal insulator metal (MIM) capacitor 430) includes electrodes 432 and 434 (e.g., Copper electrodes), a dielectric material 433, and an optional solder cap 435. A capacitive bump 440 (e.g., metal insulator metal (MIM) capacitor 440) includes electrodes 442 and 444 (e.g., Copper electrodes), a dielectric material 443, and an optional solder cap 445.

The bumps 420, 430, 440, and 450 are coupled to a package substrate with pads 481-483. For this example, the pad and connection 482 couple both bumps 420 and 450 to the package substrate 480 to form a resonator 490 by connecting bumps of different types.

Figure 5:
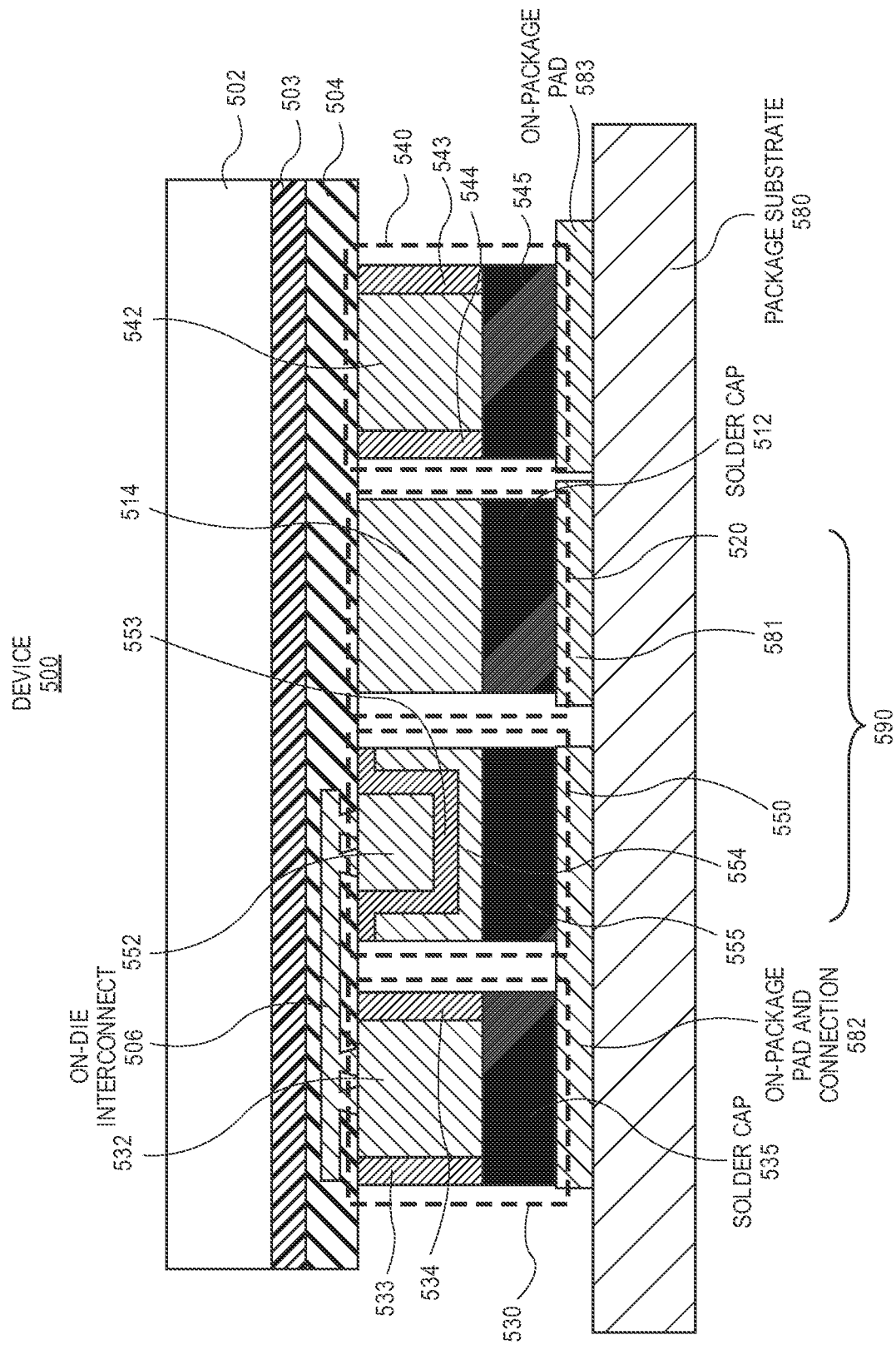
FIG. 5 illustrates a cross-sectional view of a microelectronic device having capacitive and inductive bumps that are coupled to a package substrate in accordance with one embodiment.

FIG. 5 illustrates a cross-sectional view of a microelectronic device having capacitive and inductive bumps that are coupled to a package substrate in accordance with one embodiment. The microelectronic device 500 includes a semiconductor substrate 502 (e.g., Silicon semiconductor substrate), front end layers 503 for forming devices (e.g., transistors), back end layers 504 (e.g., back end layers 504 including on die interconnect 506) having conductive layers isolated with dielectric layers for connecting the devices of the front end layers to conductive bumps (e.g., bump 520, capacitive bump 550, inductive bumps 530 and 540). A traditional bump 520 includes an electrode 514 (e.g., Copper electrode) and an optional solder cap 512. A capacitive bump 550 (e.g., metal insulator metal (MIM) capacitor 550) includes electrodes 552 and 554 (e.g., Copper electrodes), a dielectric material 553, and an optional solder cap 555. An inductive bump 530 includes conductor 532 (e.g., Copper conductors), magnetic material 533-534, and an optional solder cap 535. An inductive bump 540 includes conductor 542 (e.g., Copper conductors), magnetic material 543-544, and an optional solder cap 545.

The bumps 520, 530, 540, and 550 are coupled to a package substrate with pads 581-583. For this example, the pad and connection 582 couple both bumps 530 and 550 to the package substrate 580 to form a resonator 590 by connecting bumps of different types to each other.

FIG. 6A illustrates a cross-sectional view of a capacitive bump in accordance with one embodiment. A width of a capacitive bump 600 is shown along an x-axis and a thickness of the bump 600 is shown along a vertical z-axis. The bump 600 includes a first electrode 610, a dielectric material 620, and a second electrode 630.

Figure 6B:
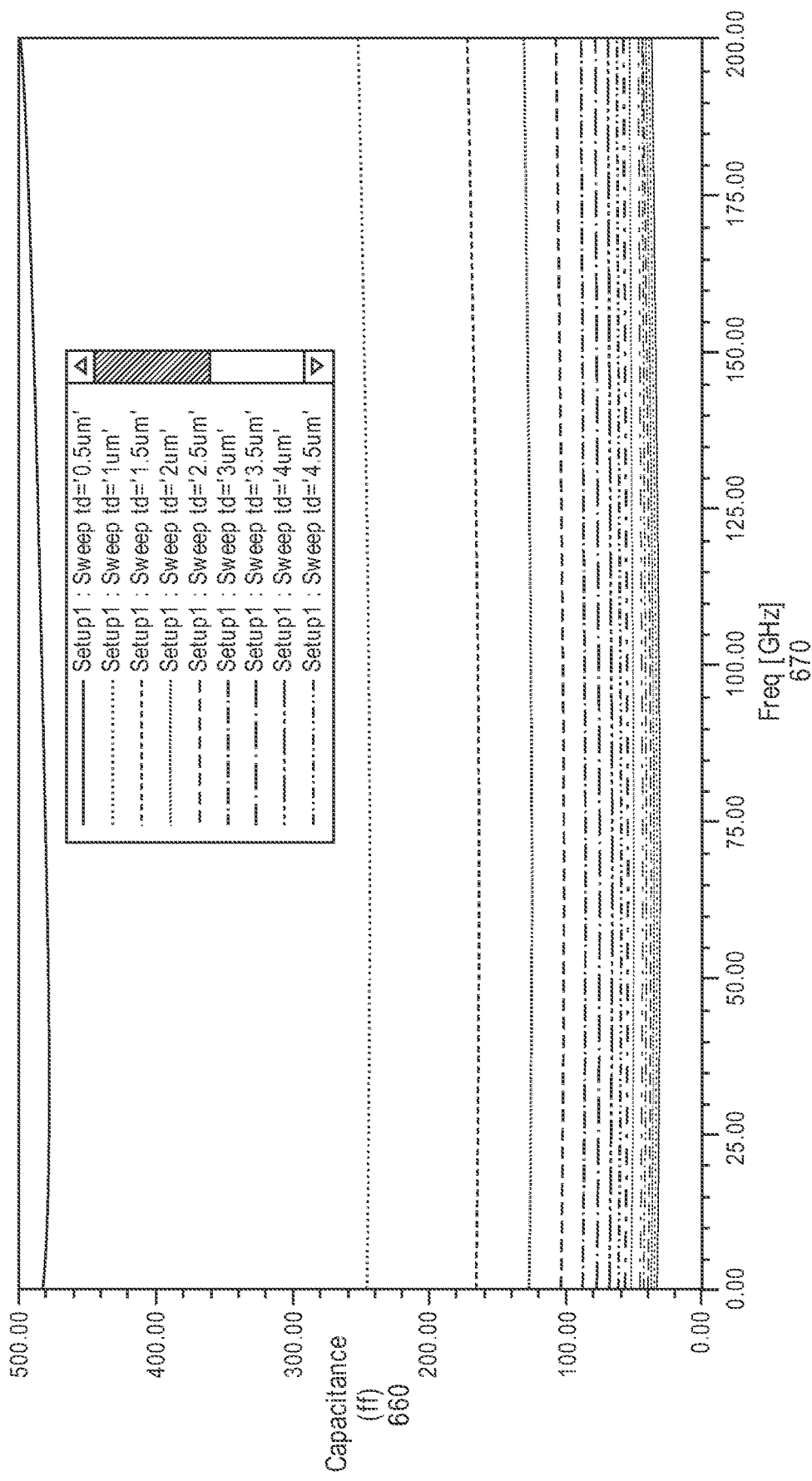
FIG. 6B illustrates a simulated capacitance versus frequency for a variable dielectric thickness for capacitive bumps in accordance with one embodiment.

FIG. 6B illustrates a simulated capacitance versus frequency for a variable dielectric thickness (td) for capacitive bumps in accordance with one embodiment. A capacitance in femtoFarads (fF) is plotted on a vertical axis and frequency in GHz is plotted on a horizontal axis. The dielectric thickness (td) varies from 0.5 microns to 4.5 microns for different lines to obtain a capacitance of approximately 500 fF to 25 fF. In this example, the capacitive bumps have a self-resonance above 200 GHz (e.g., 300-400 GHz, 600-700 GHz).

Capacitive bumps can be utilized for RF and high speed signaling applications while inductive bumps can be utilized for power delivery.

It will be appreciated that, in a system on a chip embodiment, the die may include a processor, memory, communications circuitry and the like. Though a single die is illustrated, there may be none, one or several dies included in the same region of the wafer.

In one embodiment, the microelectronic device may be a crystalline substrate formed using a bulk silicon or a silicon-on-insulator substructure. In other implementations, the microelectronics device may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of embodiments of the present invention.

Figure 7:
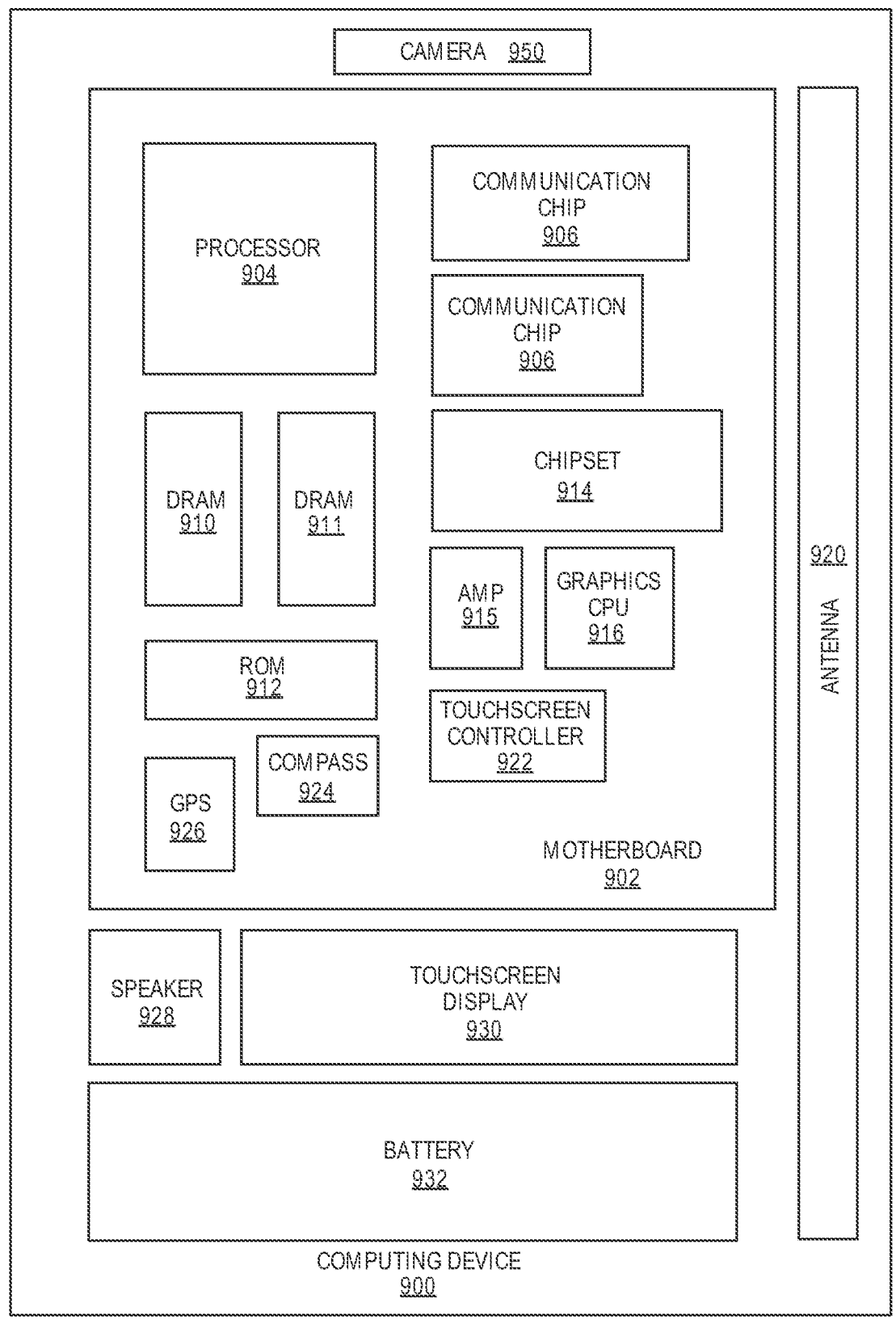
FIG. 7 illustrates a computing device 900 in accordance with one embodiment.

FIG. 7 illustrates a computing device 900 in accordance with one embodiment. The computing device 900 houses a board 902. The board (e.g., motherboard, printed circuit board, etc.) may include a number of components, including but not limited to at least one processor 904 and at least one communication chip 906. The at least one processor 904 is physically and electrically coupled to the board 902. In some implementations, the at least one communication chip 906 is also physically and electrically coupled to the board 902. In further implementations, the communication chip 906 is part of the processor 904. In one example, the communication chip 906 (e.g., microelectronic device 100, 200, 300, 400, 500, etc.) includes an antenna unit 920.

Depending on its applications, computing device 900 may include other components that may or may not be physically and electrically coupled to the board 902. These other components include, but are not limited to, volatile memory (e.g., DRAM 910, 911), non-volatile memory (e.g., ROM 912), flash memory, a graphics processor 916, a digital signal processor, a crypto processor, a chipset 914, an antenna unit 920, a display, a touchscreen display 930, a touchscreen controller 922, a battery 932, an audio codec, a video codec, a power amplifier 915, a global positioning system (GPS) device 926, a compass 924, a gyroscope, a speaker, a camera 950, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), WiGig, IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi, WiGig, and Bluetooth and a second communication chip 906 may be dedicated to longer range wireless communications such as GPS, EDGE, GPRS, CDMA, WiMAX, LTE, Ev-DO, 5G, and others.

The at least one processor 904 of the computing device 900 includes an integrated circuit die packaged within the at least one processor 904. In some embodiments of the invention, the processor package includes one or more devices, such as microelectronic devices (e.g., microelectronic device 100, 200, 300, 400, 500, etc.) in accordance with implementations of embodiments of the invention. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the invention, the communication chip package includes one or more microelectronic devices (e.g., microelectronic device 100, 200, 300, 400, 500, etc.).

The following examples pertain to further embodiments. Example 1 is a microelectronic device that includes a substrate having transistor layers and interconnect layers including conductive layers to form connections to transistor layers and a capacitive bump disposed on the interconnect layers. The capacitive bump includes a first electrode, a dielectric layer, and a second electrode.

In example 2, the subject matter of example 1 can optionally include the capacitive bump further comprising a solder cap that contacts the second electrode to enable electrical connection to a package substrate having an inductor to create hybrid high quality filters for millimeter wave frequency circuits.

In example 3, the subject matter of any of examples 1-2 can optionally include the first electrode being coupled to a conductive layer of the interconnect layers.

In example 4, the subject matter of any of examples 1-3 can optionally include the dielectric layer having a thickness range of 0.05 (50 nanometer) to 10 microns.

In example 5, the subject matter of any of examples 1-4 can optionally include the capacitive bump vinga capacitance of 10 femto Farads to 1000 femto Farads.

In example 6, the subject matter of any of examples 1-5 can optionally include the dielectric layer surrounding the first electrode and the second electrode surrounding the dielectric layer.

In example 7, the subject matter of any of examples 1-7 can optionally include a passivation layer formed on the interconnect layers. The dielectric layer and the first electrode are formed within an opening of the passivation layer and the second electrode is disposed on the passivation layer.

Example 8 is a microelectronic device comprising a substrate having transistor layers and interconnect layers including conductive layers to form connections to transistor layers and an inductive bump disposed on the interconnect layers. The inductive bump includes a conductor and a magnetic layer that surrounds the conductor.

In example 9, the subject matter of example 8 can optionally include the inductive bump further comprising a solder cap that contacts the conductor to enable electrical connection to a package substrate or another microelectronic device.

In example 10, the subject matter of any of examples 8-9 can optionally include the conductor being coupled to a conductive layer of the interconnect layers.

In example 11, the subject matter of any of examples 8-10 can optionally include the magnetic layer having a thickness range of 0.05 to 10 microns.

In example 12, the subject matter of any of examples 8-11 can optionally include a bump disposed on the interconnect layers. The bump includes an electrode and a solder cap.

In example 13, the subject matter of any of examples 8-12 can optionally include the inductive bump providing power delivery for devices of the transistor layers.

Example 14 is a computing device comprising at least one processor to process data and a communication module or chip coupled to the at least one processor. The communication module or chip comprises a semiconductor substrate having transistor layers and interconnect layers including conductive layers to form connections to transistor layers and a capacitive bump disposed on the interconnect layers. The capacitive bump includes a first electrode, a dielectric layer, and a second electrode.

In example 15, the subject matter of example 14 can optionally include the communication module or chip further comprising a package substrate and the capacitive bump further comprising a solder cap that contacts the second electrode to enable electrical connection to the package substrate having an inductor to create hybrid high quality filters for millimeter wave and sub-THz frequency circuits.

In example 16, the subject matter of any of examples 14-15 can optionally include the first electrode being coupled to a conductive layer of the interconnect layers.

In example 17, the subject matter of any of examples 14-16 can optionally include the dielectric layer having a thickness range of 0.05 to 10 microns.

In example 18, the subject matter of any of examples 14-17 can optionally include the capacitive bump having a capacitance of 10 femto Farads to 1000 femto Farads.

In example 19, the subject matter of any of examples 14-18 can optionally include the dielectric layer surrounding the first electrode and the second electrode surrounding the dielectric layer.

In example 20, the subject matter of any of examples 14-19 can optionally include a passivation layer formed on the interconnect layers. The dielectric layer and the first electrode are formed within an opening of the passivation layer and the second electrode is disposed on the passivation layer.

In example 21, the subject matter of any of examples 14-20 can optionally include a bump disposed on the interconnect layers. The bump includes an electrode and a solder cap with the bump being coupled to the capacitive bump with a conductive layer of the interconnect layers to form a resonator.

What is claimed is:

1. A microelectronic device comprising:
    a substrate having transistor layers and interconnect layers including conductive layers to form connections to transistor layers; and
    a capacitive bump disposed on the interconnect layers, the capacitive bump comprising a first electrode, a dielectric layer, and a second electrode, wherein the dielectric layer is on a top and sides of the first electrode.

2. The microelectronic device of claim 1, wherein the capacitive bump further comprising a solder cap that contacts the second electrode to enable electrical connection to a package substrate having an inductor to create hybrid high quality filters for millimeter wave frequency circuits.

3. The microelectronic device of claim 1, wherein the first electrode is coupled to a conductive layer of the interconnect layers.

4. The microelectronic device of claim 1, wherein the dielectric layer has a thickness range of 0.05 to 10 microns.

5. The microelectronic device of claim 4, wherein the capacitive bump has a capacitance of 10 femto Farads to 1000 femto Farads.

6. The microelectronic device of claim 1, wherein the dielectric layer surrounds the first electrode and the second electrode surrounds the dielectric layer.

7. The microelectronic device of claim 6, further comprising: a passivation layer formed on the interconnect layers, wherein the dielectric layer and the first electrode are formed within an opening of the passivation layer and the second electrode is disposed on the passivation layer.

8. A microelectronic device comprising:
    a substrate having transistor layers and interconnect layers including conductive layers to form connections to transistor layers; and
    an inductive bump disposed on the interconnect layers, the inductive bump includes a conductor and a magnetic layer that surrounds the conductor, wherein the inductive bump comprises a solder cap that contacts the conductor to enable electrical connection to a package substrate or another microelectronic device.

9. The microelectronic device of claim 8, wherein the conductor is coupled to a conductive layer of the interconnect layers.

10. The microelectronic device of claim 8, wherein the magnetic layer has a thickness range of 0.05 to 10 microns.

11. The microelectronic device of claim 8, further comprising:
    a bump disposed on the interconnect layers, the bump including an electrode and a solder cap.

12. The microelectronic device of claim 8, wherein the inductive bump provides power delivery for devices of the transistor layers.

13. A computing device comprising:
    at least one processor to process data; and a communication module or chip coupled to the at least one processor, the communication module or chip comprises, a semiconductor substrate having transistor layers and interconnect layers including conductive layers to form connections to transistor layers and a capacitive bump disposed on the interconnect layers, the capacitive bump comprising a first electrode, a dielectric layer, and a second electrode, wherein the dielectric layer is on a top and sides of the first electrode.

14. The computing device of claim 13, wherein the communication module or chip further comprises a package substrate and the capacitive bump further comprising a solder cap that contacts the second electrode to enable electrical connection to the package substrate having an inductor to create hybrid high quality filters for millimeter wave and sub-THz frequency circuits.

15. The computing device of claim 13, wherein the first electrode is coupled to a conductive layer of the interconnect layers.

16. The computing device of claim 13, wherein the dielectric layer has a thickness range of 0.05 to 10 microns.

17. The computing device of claim 16, wherein the capacitive bump has a capacitance of 10 femto Farads to 1000 femto Farads.

18. The computing device of claim 13, wherein the dielectric layer surrounds the first electrode and the second electrode surrounds the dielectric layer.

19. The computing device of claim 18, further comprising:
a passivation layer formed on the interconnect layers, wherein the dielectric layer and the first electrode are formed within an opening of the passivation layer and the second electrode is disposed on the passivation layer.

20. The computing device of claim 13, further comprising:
a bump disposed on the interconnect layers, the bump including an electrode and a solder cap with the bump being coupled to the capacitive bump with a conductive layer of the interconnect layers to form a resonator.

21. A microelectronic device comprising:
a substrate having transistor layers and interconnect layers including conductive layers to form connections to transistor layers; and
a capacitive bump disposed on the interconnect layers, the capacitive bump comprising a first electrode, a dielectric layer, and a second electrode, and the capacitive bump further comprising a solder cap that contacts the second electrode to enable electrical connection to a package substrate having an inductor to create hybrid high quality filters for millimeter wave frequency circuits.

22. A computing device comprising:
at least one processor to process data;
a communication module or chip coupled to the at least one processor, the communication module or chip comprises, a semiconductor substrate having transistor layers and interconnect layers including conductive layers to form connections to transistor layers and a capacitive bump disposed on the interconnect layers, the capacitive bump comprising a first electrode, a dielectric layer, and a second electrode; and
a bump disposed on the interconnect layers, the bump including an electrode and a solder cap with the bump being coupled to the capacitive bump with a conductive layer of the interconnect layers to form a resonator.

* * * * *